(12) United States Patent
Jung et al.

(10) Patent No.: US 8,927,993 B2
(45) Date of Patent: Jan. 6, 2015

(54) ARRAY SUBSTRATE FOR FRINGE FIELD SWITCHING MODE LIQUID CRYSTAL DISPLAY AND METHOD OF MANUFACTURING THE SAME

(71) Applicant: LG Display Co., Ltd., Seoul (KR)

(72) Inventors: Young-Ki Jung, Gyeonggi-do (KR); Seok-Woo Lee, Gyeonggi-do (KR); Kum-Mi Oh, Seoul (KR); Dong-Cheon Shin, Gyeonggi-do (KR); In-Hyuk Song, Gyeonggi-do (KR); Han-Seok Lee, Seoul (KR); Won-Keun Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 48 days.

(21) Appl. No.: 13/895,677

(22) Filed: May 16, 2013

(65) Prior Publication Data

US 2013/0248870 A1    Sep. 26, 2013

Related U.S. Application Data

(62) Division of application No. 13/301,015, filed on Nov. 21, 2011, now Pat. No. 8,465,995.

(30) Foreign Application Priority Data

Jun. 30, 2011    (KR) ........................ 10-2011-0064733

(51) Int. Cl.
| | | |
|---|---|---|
| *H01L 29/10* | (2006.01) | |
| *H01L 27/14* | (2006.01) | |
| *H01L 27/088* | (2006.01) | |
| *H01L 29/66* | (2006.01) | |
| *H01L 29/786* | (2006.01) | |
| *H01L 27/12* | (2006.01) | |
| *G02F 1/1343* | (2006.01) | |
| *G02F 1/1362* | (2006.01) | |

(52) U.S. Cl.
CPC ........ *H01L 27/088* (2013.01); *H01L 29/66757* (2013.01); *H01L 29/78633* (2013.01); *H01L 27/1248* (2013.01); *H01L 27/1288* (2013.01); *G02F 2001/134372* (2013.01); *G02F 2001/136236* (2013.01)
USPC ........ 257/59; 257/72; 257/258; 257/E27.111; 257/E21.158; 257/E29.295; 349/141; 349/139; 438/30; 438/34

(58) Field of Classification Search
CPC ............ H01L 27/1214; H01L 27/3248; H01L 27/088; H01L 27/12; H01L 27/13; H01L 27/1248; H01L 27/1288; H01L 27/14658; H01L 27/14692; H01L 29/41733; H01L 29/78633; H01L 29/1288; H01L 29/66757; H01L 29/78627; H01L 29/78621; H01L 29/78624; H01L 29/78603
USPC ........... 257/59, 72, 258, 291, 66, 71, 213, 88, 257/390, E27.111, E27.113, E27.14, E21.4, 257/E21.148, E21.158, E21.409, E21.411, 257/E21.412, E21.616, E29.295, E33.004, 257/E33.053, E33.055, E33.065, E33.064; 438/34, 30, 23, 149, 158, 159, 160, 438/166, 165, 670; 349/84, 41, 46, 58, 62, 349/96, 106, 114, 139, 140, 141, 149, 152, 349/158, 187
See application file for complete search history.

(56) References Cited

U.S. PATENT DOCUMENTS

| | | | |
|---|---|---|---|
| 2003/0100150 A1* | 5/2003 | Kitakado et al. | 438/151 |
| 2005/0046771 A1 | 3/2005 | Lee et al. | |
| 2008/0309853 A1* | 12/2008 | Ge et al. | 349/96 |
| 2009/0021687 A1* | 1/2009 | Kwack et al. | 349/158 |
| 2010/0141879 A1* | 6/2010 | Lee et al. | 349/114 |
| 2011/0024753 A1* | 2/2011 | Liou | 257/59 |
| 2012/0184060 A1 | 7/2012 | Song et al. | |

* cited by examiner

*Primary Examiner* — Wensing Kuo
*Assistant Examiner* — Moazzam Hossain
(74) *Attorney, Agent, or Firm* — Morgan, Lewis & Bockius LLP

(57) ABSTRACT

A method of manufacturing an array substrate for a fringe field switching mode liquid crystal display includes: forming an auxiliary insulating layer on a second passivation layer and having a first thickness; forming first and second photoresist patterns on the auxiliary insulating layer and having second and third thicknesses, respectively, the second thickness greater than the third thickness; etching the auxiliary insulating layer, the second passivation layer and a first passivation layer to form a drain contact hole; performing an ashing to remove the second photoresist pattern and expose the auxiliary insulating layer therebelow; performing a dry etching to remove the auxiliary insulating layer not covered by the first photoresist pattern and expose the first passivation layer and to form an insulating pattern below the first photoresist pattern, the insulating pattern and the first photoresist pattern forming an undercut shape; forming a transparent conductive material layer having a fourth thickness less than the first thickness; and performing a lift-off process to remove the first photoresist pattern and the transparent conductive material layer thereon together and form a pixel electrode as a remaining portion of the transparent conductive material layer.

6 Claims, 11 Drawing Sheets

_US 8,927,993 B2_

ARRAY SUBSTRATE FOR FRINGE FIELD SWITCHING MODE LIQUID CRYSTAL DISPLAY AND METHOD OF MANUFACTURING THE SAME

The present application is a divisional of U.S. patent application Ser. No. 13/301,015, filed on Nov. 21, 2011, which claims the benefit of Korean Patent Application No. 10-2011-0064733, filed in Korea on Jun. 30, 2011, the entire contents of each of which is hereby incorporated by reference for all purposes as if fully set forth herein.

BACKGROUND OF THE INVENTION

1. Field of the Invention

The present invention relates to a liquid crystal display, and more particularly, to an array substrate for a fringe field switching mode liquid crystal display and a method of manufacturing the same.

2. Discussion of the Related Art

Until recently, display devices have typically used cathode-ray tubes (CRTs). Presently, many efforts and studies are being made to develop various types of flat panel displays, such as liquid crystal displays (LCD), plasma display panels (PDPs), field emission displays, and electro-luminescence displays (ELDs), as a substitute for CRTs. Of these flat panel displays, LCD have many advantages, such as high resolution, light weight, thin profile, compact size, and low voltage power supply requirements.

In general, an LCD includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD. Thus, the LCD displays images by varying the intensity of the induced electric field.

However, the LCD operated by the electric field induced between the two electrodes on the two substrates does not have wide viewing angle property. To solve this problem, an in-plane switching (IPS) mode LCD is suggested.

FIG. 1 is a schematic cross-sectional view illustrating an IPS mode LCD.

Referring to FIG. 1, the IPS mode LCD includes a lower substrate 10 as an array substrate, an upper substrate 9 as a color filter substrate, and a liquid crystal layer 11 between the two substrates 9 and 10.

A common electrode 17 and a pixel electrode 30 is formed at the lower substrate 10, and the liquid crystal layer 11 is operated by an in-plane electric field L induced by the common electrode 17 and the pixel electrode 30.

FIGS. 2A and 2B are views illustrating operations in on and off states, respectively, of the IPS mode LCD.

Referring to FIG. 2A that shows arrangement of liquid crystal molecules in the on state, arrangement of the liquid crystal molecules 11a on the common and pixel electrodes 17 and 30 substantially remain unchanged as initial while arrangement of the liquid crystal molecules 110b between the common and pixel electrodes 17 and 30 is changed along the in-plane electric field L that is induced by applying voltages to the electrodes 17 and 30. In other words, since the liquid crystal molecules are operated by the in-plane electric field L, the IPS mode LCD can have wide viewing angles.

Accordingly, when the IPS mode LCD is viewed from the front, images is normally viewable up to about 80 degrees angle to about 85 degrees angle in up/down/left/right directions.

Referring to FIG. 2B that shows arrangement of liquid crystal molecules in the off state, since the in-plane electric field L is not induced between the common and pixel electrodes 17 and 30, arrangement of all liquid crystal molecules 11 substantially remains unchanged.

The IPS mode LCD has the advantage of wide viewing angles but has a disadvantage of low aperture ratio and transmittance.

To solve the problem of the IPS mode LCD device, a fringe field switching (FFS) mode LCD is suggested that is operated by a fringe field.

FIG. 3 is a cross-sectional view illustrating a FFS mode LCD according to the related art.

Referring to FIG. 3, on a substrate 31 of an array substrate of the FFS mode LCD, a light-blocking layer 33 is formed corresponding to a switching region TrA where a thin film transistor Tr is formed. A buffer layer 38 is formed on the light-blocking layer 33.

A semiconductor layer 50 made of polysilicon is formed in the switching region TrA on the buffer layer 38.

A gate insulating layer 55 is formed on the semiconductor layer 50, and a gate electrode 62 is in the switching region TrA on the gate insulating layer 55. An inter-layered insulating film 70 is formed on the gate insulating layer 70 and includes first and second semiconductor contact holes 73a and 73b. Source and drain electrodes 78 and 80 are formed on the inter-layered insulating film 70 and contacts the semiconductor layer 50 through the first and second semiconductor contact holes 73a and 73b, respectively.

The semiconductor layer 50, the gate insulating layer 55, the gate electrode 62, the inter-layered insulating film 70 and the source and drain electrodes 78 and 80 form the thin film transistor Tr.

A first passivation layer 85 is formed on the source and drain electrodes 78 and 80, and a common electrode 90 is formed on the first passivation layer 85 and includes a first opening op1 corresponding to the switching region TrA.

A second passivation layer 92 is formed on the common electrode 90. The first and second passivation layers 85 and 92 have a drain contact hole 93 exposing the drain electrode 80.

A pixel electrode 99 is formed in each pixel region P on the second passivation layer 92, contacts the drain electrode 80 through the drain contact hole 93, and includes a plurality of second openings op2 that each have a bar shape.

The array substrate of the FFS mode LCD is manufactured with 9 mask processes including a doping process for the semiconductor layer 50.

In other words, the array substrate is manufactured through a process of forming the light-blocking layer 33, a process of forming the polysilicon semiconductor layer 50, a process of forming a gate line (not shown) and the gate electrode 62, a process of forming the inter-layered insulating film 70 including the semiconductor contact holes 73a and 73b, a process of forming a data line (not shown) and the source and drain electrodes 78 and 80, a process of forming the first passivation layer 85, a process of forming the common electrode 90 including the first opening op1, a process of forming the second passivation layer 92, and a process of forming the pixel electrode 99 including the second openings op2.

Each mask process includes many unit processes, such as forming a material layer to be patterned on a substrate, forming a photoresist layer on the material layer, light-exposing the photoresist layer using a photo mask, developing the light-exposed photoresist layer, etching the material layer using a photoresist pattern that remains after the developing, and stripping the photoresist pattern.

To perform each mask process, a unit process apparatus and a material is needed for each unit process, and further, a time for each unit process is needed.

Accordingly, increase of the mask processes involves increase of production cost and time. Therefore, reduction of the mask processes is required to reduce production cost and time.

SUMMARY OF THE INVENTION

Accordingly, the present invention is directed to an array substrate for a fringe field switching mode liquid crystal display and a method of manufacturing the same which substantially obviates one or more of the problems due to limitations and disadvantages of the related art.

An advantage of the present invention is to provide an array substrate for a fringe field switching mode liquid crystal display and a method of manufacturing the same that can improve production efficiency.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, a method of manufacturing an array substrate for a fringe field switching mode liquid crystal display includes: forming a thin film transistor in a pixel region on a substrate; forming a first passivation layer on the thin film transistor; forming a common electrode on the first passivation layer; forming a second passivation layer on the common electrode; forming an auxiliary insulating layer on the second passivation layer and having a first thickness; forming first and second photoresist patterns on the auxiliary insulating layer and having second and third thicknesses, respectively, the second thickness greater than the third thickness; etching the auxiliary insulating layer, the second passivation layer and the first passivation layer using the first and second photoresist patterns as an etching mask to form a drain contact hole exposing a drain electrode of the thin film transistor; performing an ashing to remove the second photoresist pattern and expose the auxiliary insulating layer therebelow; performing a dry etching to remove the auxiliary insulating layer not covered by the first photoresist pattern and expose the first passivation layer and to form an insulating pattern below the first photoresist pattern, the insulating pattern and the first photoresist pattern forming an undercut shape; forming a transparent conductive material layer on the substrate having the first photoresist pattern and having a fourth thickness less than the first thickness; and performing a lift-off process to remove the first photoresist pattern and the transparent conductive material layer thereon together and form a pixel electrode as a remaining portion of the transparent conductive material layer.

In another aspect, an array substrate for a fringe field switching mode liquid crystal display, the substrate includes: a thin film transistor in a pixel region on a substrate; a first passivation layer on the thin film transistor; a common electrode on the first passivation layer; a second passivation layer on the common electrode; an insulating pattern of a bar shape on the second passivation layer and having a first thickness; and a pixel electrode on the second passivation layer, including an opening that is filled with the insulating pattern, and contacting a drain electrode of the thin film transistor through a drain contact hole that is formed in the first and second passivation layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
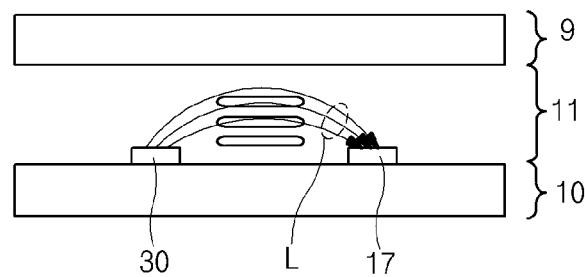
FIG. 1 is a schematic cross-sectional view illustrating an IPS mode LCD.
Figure 2A:
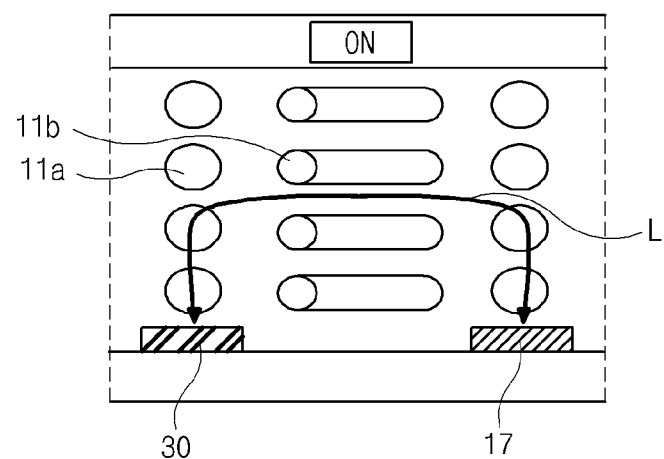
FIGS. 2A and 2B are views illustrating operations in on and off states, respectively, of an IPS mode LCD.
Figure 2B:
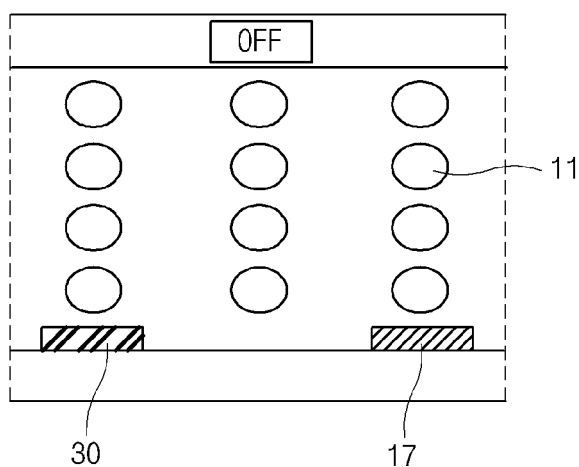
Figure 3:
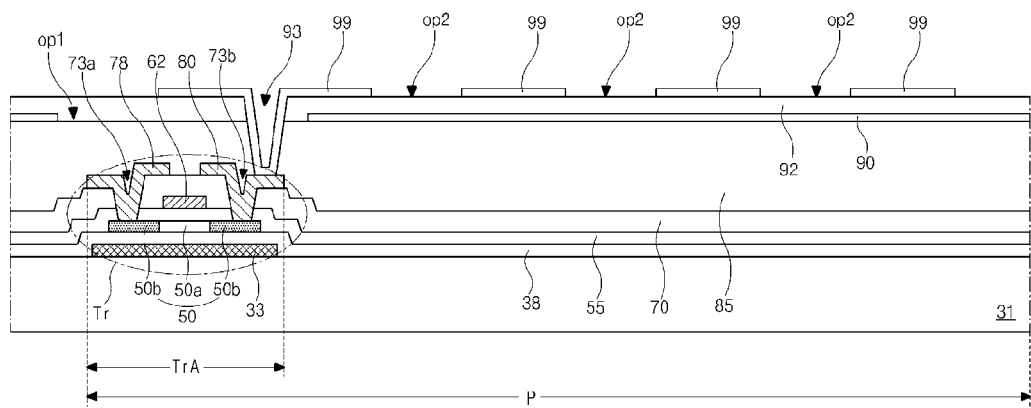
FIG. 3 is a cross-sectional view illustrating a FFS mode LCD according to the related art.
Figure 4A:
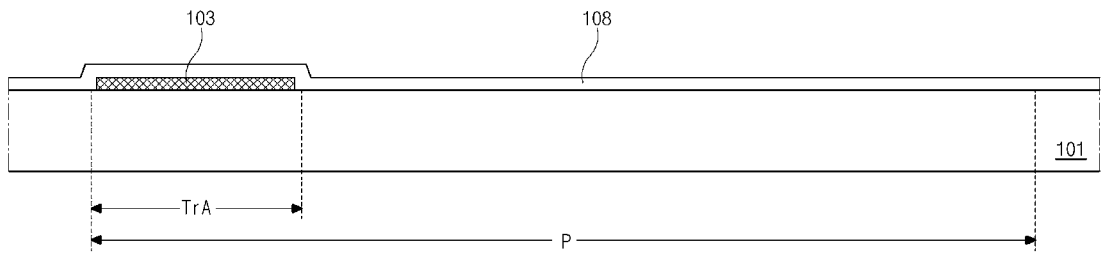
FIGS. 4A to 4R are cross-sectional views illustrating a method of manufacturing an array substrate of an LCD according to an embodiment of the present invention.
Figure 4B:
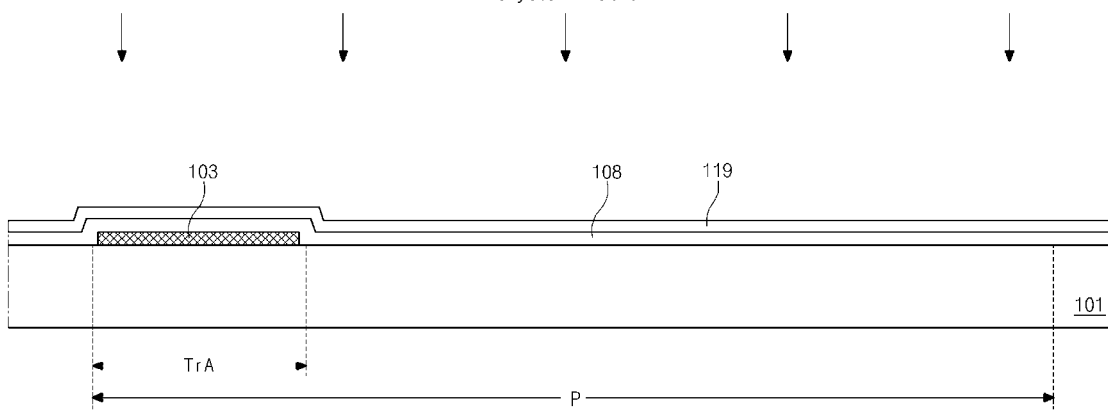
Figure 4C:
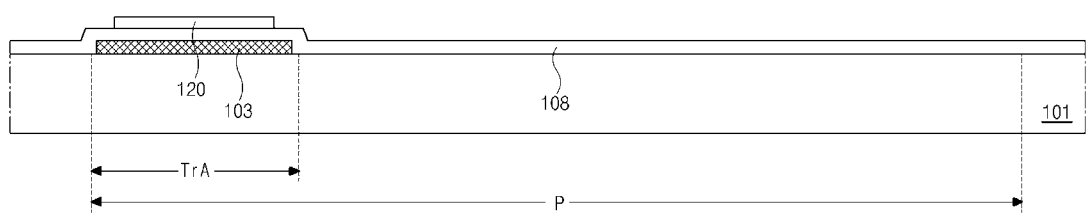
Figure 4D:
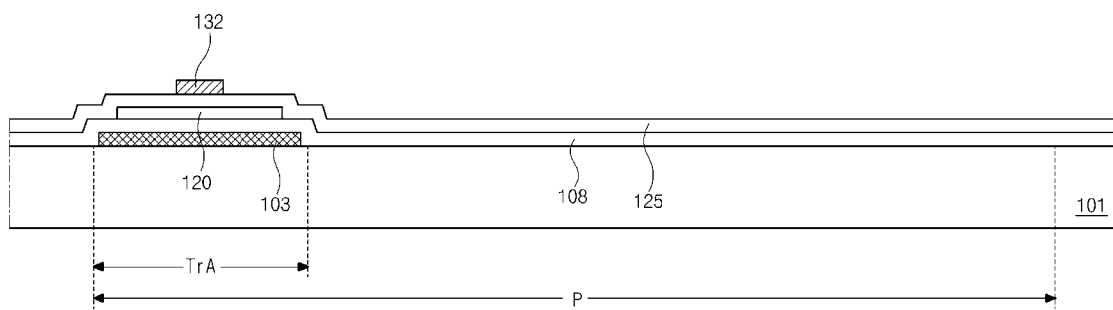
Figure 4E:
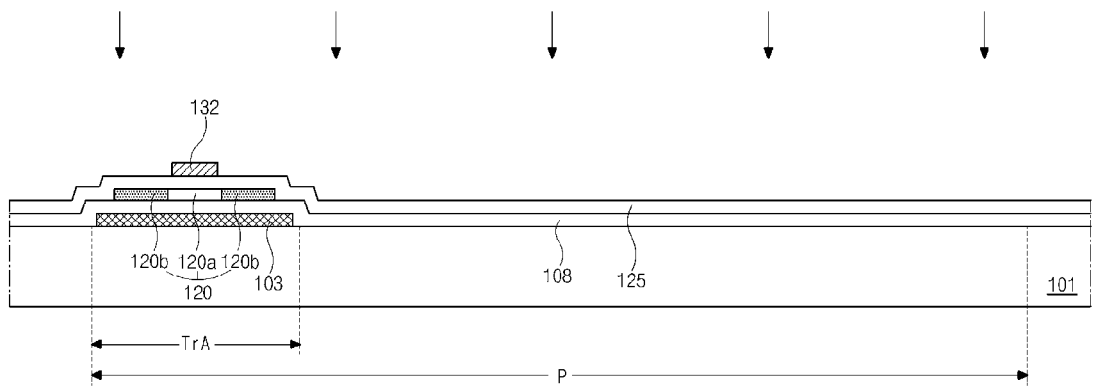
Figure 4F:
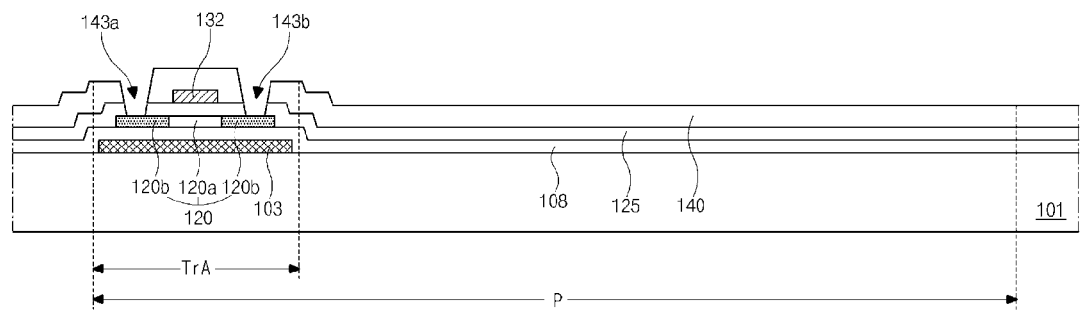
Figure 4G:
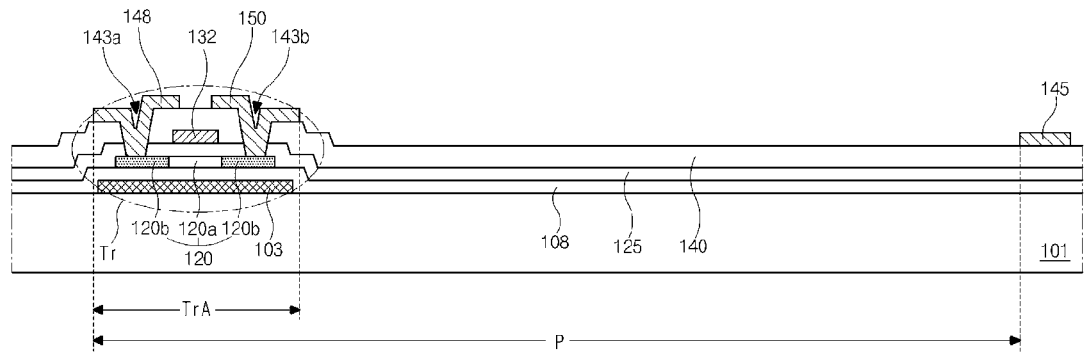
Figure 4H:
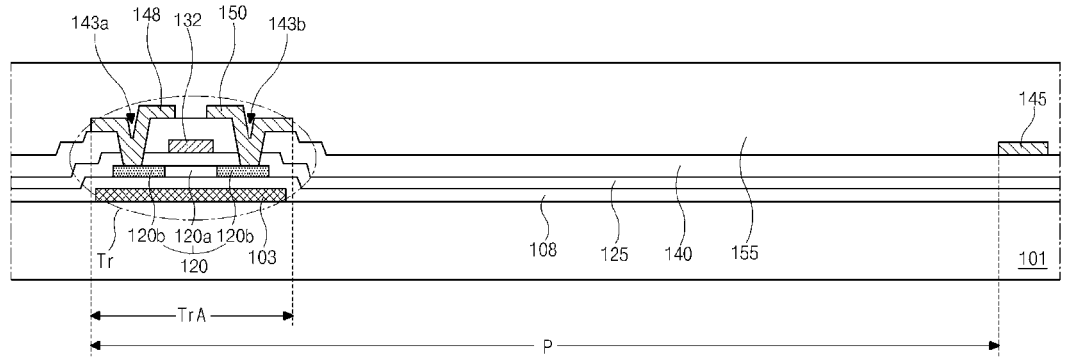
Figure 4I:
Figure 4J:
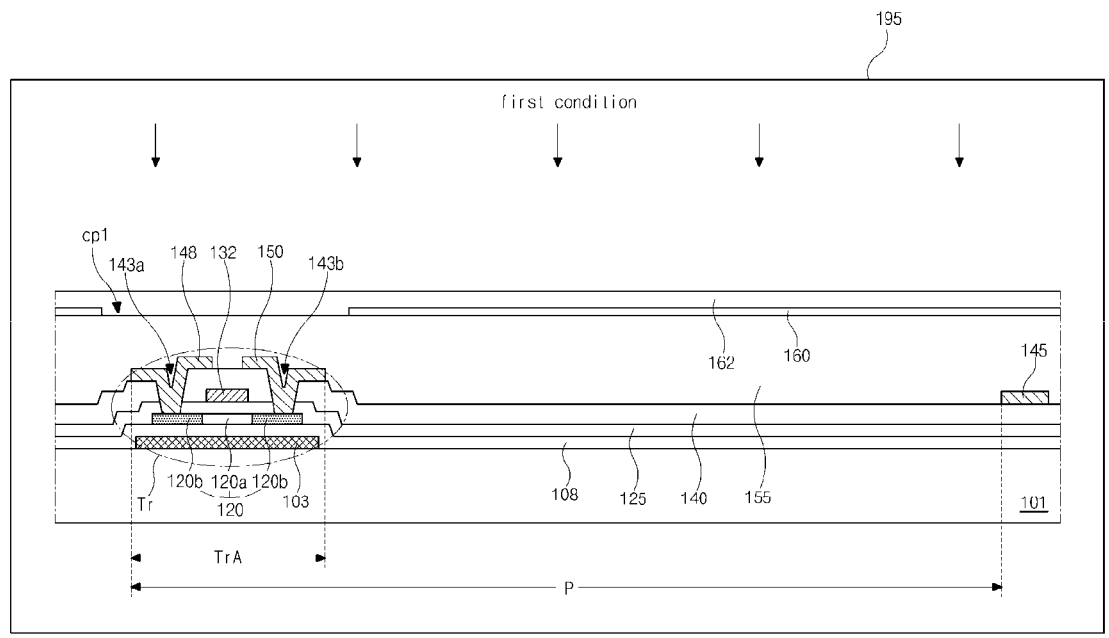
Figure 4K:
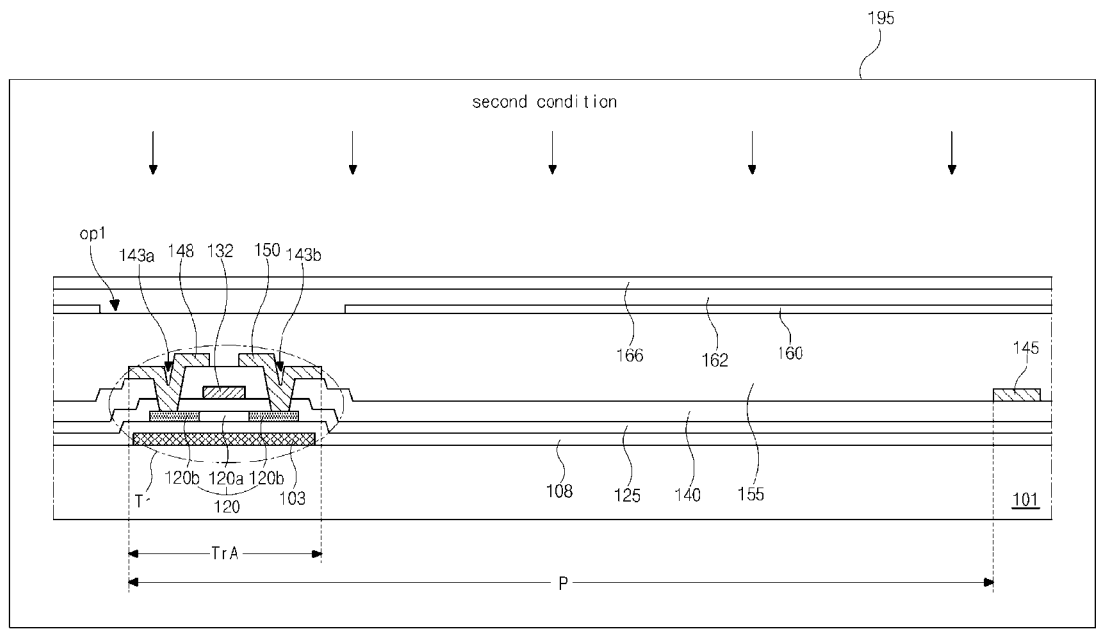
Figure 4L:
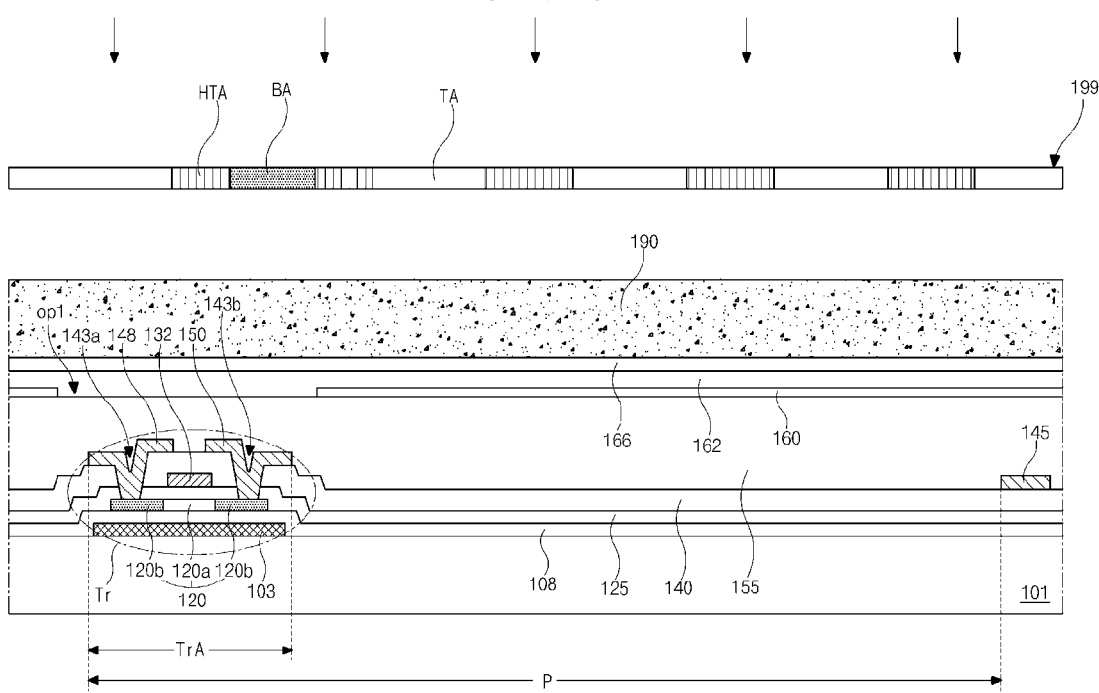
Figure 4M:
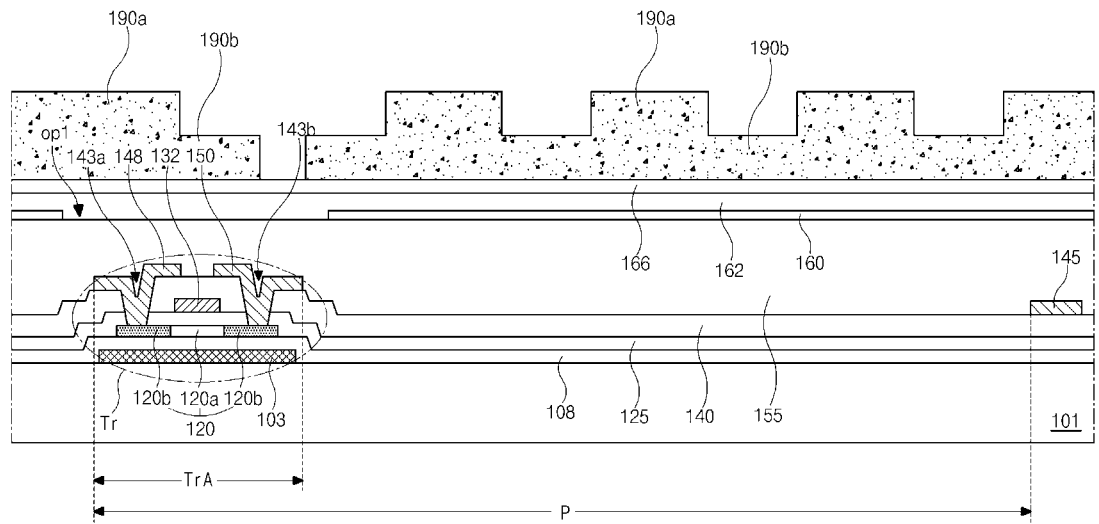
Figure 4N:
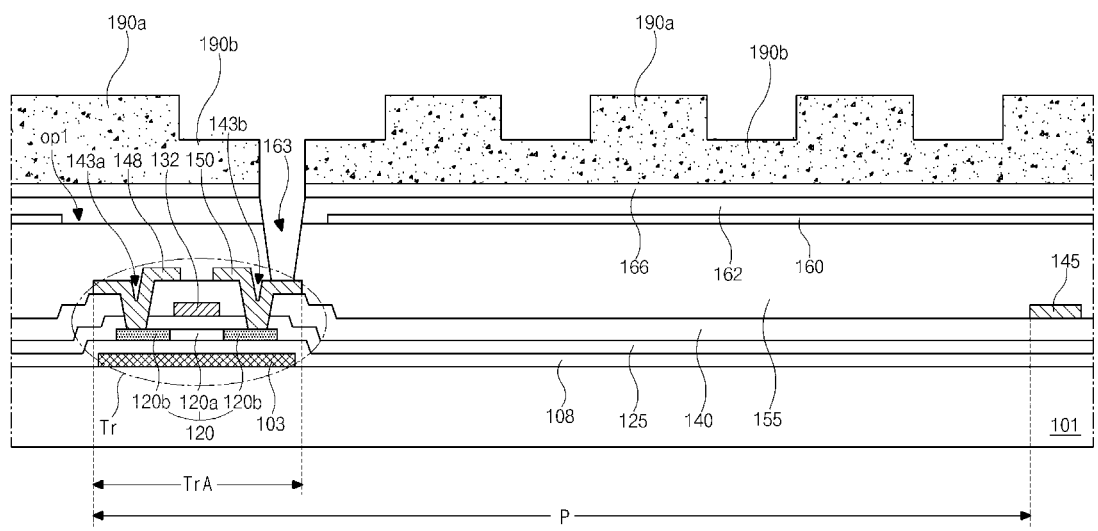
Figure 4O:
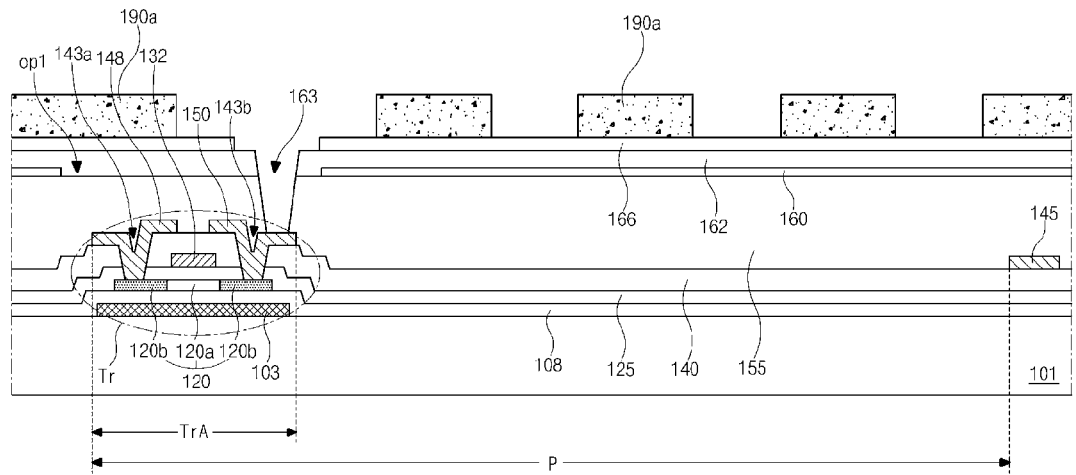
Figure 4P:
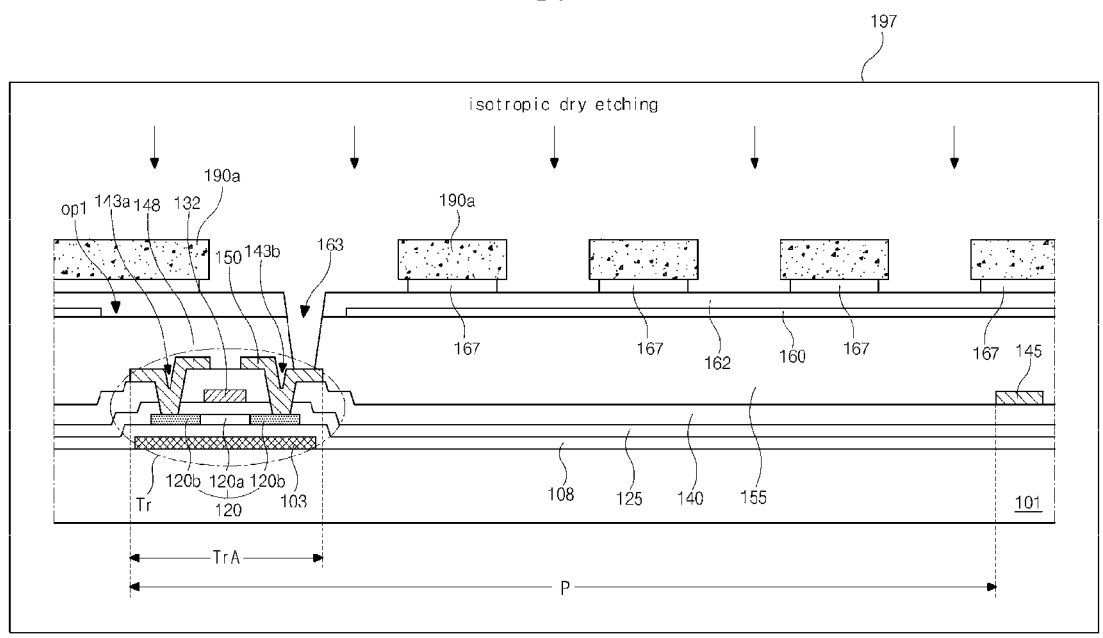
Figure 4Q:
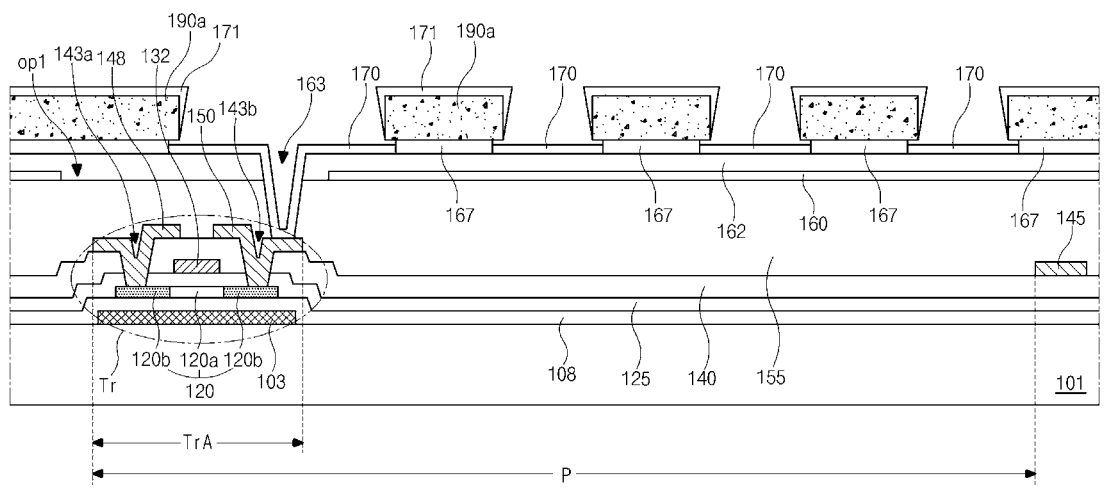
Figure 4R:
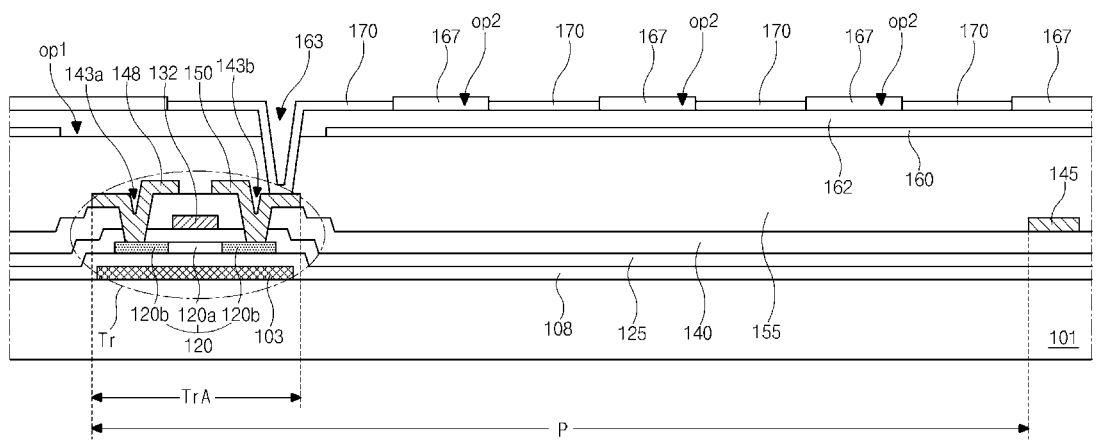

FIGS. 4A to 4R are cross-sectional views illustrating a method of manufacturing an array substrate of an LCD according to an embodiment of the present invention. In the drawings, a region, where a thin film transistor Tr is formed, in a pixel region P is defined as a switching region TrA.

Referring to FIG. 4A, an opaque metal material or a black resin having an optical density of about 4 or more is deposited on a substrate 101 and patterned in a mask process to form a light-blocking layer 103.

When a top gate type thin film transistor Tr including a semiconductor layer (120 of FIG. 4R) is used, light emitted from a backlight unit is incident on the semiconductor layer 120 and causes a photo leakage current, and property of the thin film transistor Tr is thus degraded. To prevent this, the light-blocking layer 103 is employed. However, the light-blocking layer 103 may be emitted.

Then, an inorganic insulating material such as silicon nitride (SiNx) or silicon oxide ($SiO_2$) is deposited on the substrate 101 having the light-blocking layer 103 to form a buffer layer 108. when an amorphous silicon is crystallized into a polysilicon, akali ions, for example, kalium ions, natrium ions and the like that exist inside the substrate 101 may be emitted out due to heat generated by a laser irradiation for the crystallization, and the ions causes property of the polysilicon. To prevent this, the buffer layer 108 is employed. Further, the buffer layer 108 can functions to electrically disconnect the semiconductor layer 120 from the light-emitting layer 103 that is made of a metal.

When the light-emitting layer 103 is made of a metal, it is preferred that the buffer layer 108 is formed. However, when the light-emitting layer 103 is made of a material, for example, black resin other than a metal, or it is omitted, the buffer layer 103 may be omitted depending on a material of the substrate 101.

Referring to FIG. 4B, an intrinsic amorphous silicon is deposited on the buffer layer 108 to form an intrinsic amorphous silicon layer, and then it is crystallized into an intrinsic polysilicon layer 119.

The crystallization method may be, for example, a thermal crystallization method using a thermal treatment in a condition of about 600 degrees Celsius to about 800 degrees Celsius, an alternating magnetic field crystallization method using an alternating magnetic crystallization apparatus in a condition of about 600 degrees Celsius to about 700 degrees Celsius, an excimer laser annealing (ELA) method using a laser, or a sequential lateral solidification (SLS) method.

Referring to FIG. 4C, the intrinsic polysilicon layer 119 is patterned with a mask process to form the semiconductor layer 120 in the switching region TrA corresponding to the light-blocking layer 103.

In the embodiment, the crystallization is performed in a state that the intrinsic amorphous silicon layer is formed on the entire surface of substrate 101. Alternatively, the intrinsic amorphous silicon layer may be first patterned to form an intrinsic amorphous silicon pattern in the switching region TrA, and then the crystallization is performed for the intrinsic amorphous silicon pattern to form a semiconductor layer 120 of intrinsic polysilicon.

Referring to FIG. 4D, an inorganic insulating material such as silicon nitride (SiNx) or silicon oxide (SiO$_2$) is deposited on the substrate 101 having the semiconductor layer 120 to form a gate insulating layer 125. Then, one or more of metals including aluminum (Al), aluminum alloy (e.g., AlNd), copper (Cu), copper alloy, molybdenum (Mo), and molybdenum-titanium (MoTi) is deposited on the gate insulating layer 125 to form a first metal layer having a single-layered or multi-layered structure.

Figure 7:
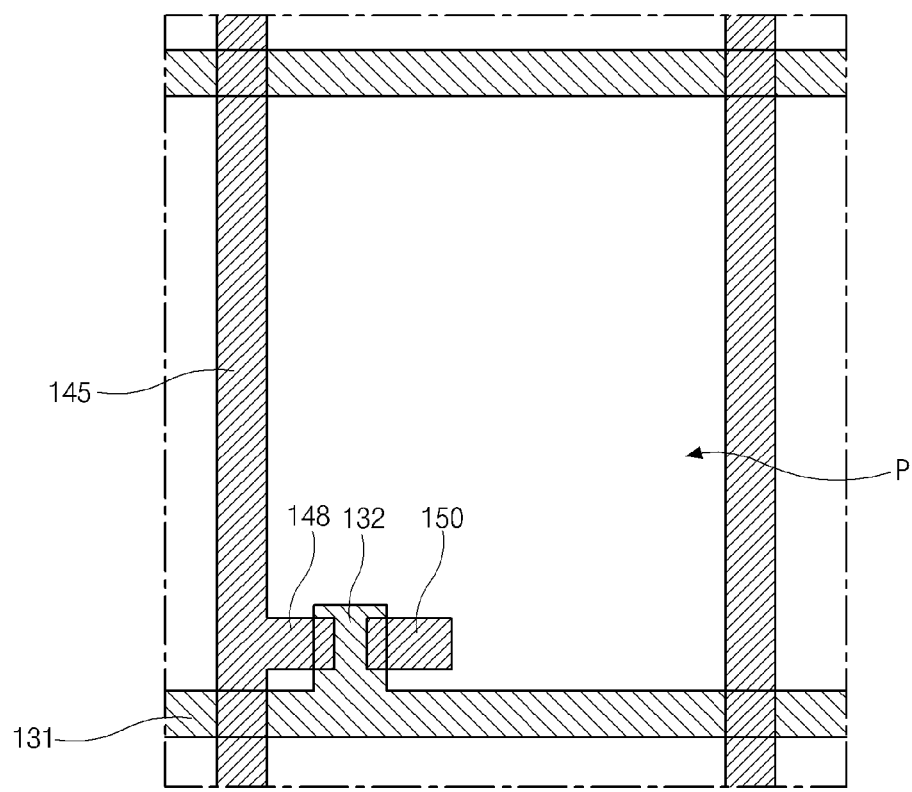
FIG. 7 is a plan view illustrating gate and data lines according to the embodiment of the present invention.

Then, the first metal layer is patterned with a mask process, a gate line 131 of FIG. 7 along a direction, and a gate electrode 132 in the switching region TrA and connected to the gate line are formed. The gate electrode 132 corresponds to a center portion of the semiconductor layer 120.

Referring to FIG. 4E, doping with n type or p type impurities is performed for the substrate 101. Accordingly, an ohmic contact layer 120b that are impurity-doped is formed at each of both side regions of the semiconductor layer 120 that are not covered by the gate electrode 132. The center portion of the semiconductor layer 120 covered by the gate electrode 132 and not impurity-doped functions as an active layer of intrinsic polysilicon. Accordingly, the semiconductor layer 120 includes the active layer 120a at the center region and the ohmic contact layers 120b at the both side regions.

In the embodiment, the semiconductor layer 120 having the active layer 120a and the ohmic contact layer 120b is shown as an example.

Figure 5A:
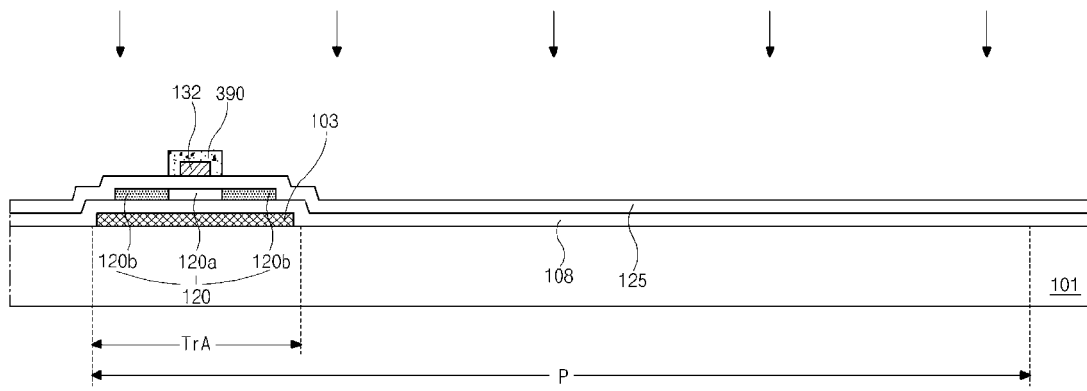
FIGS. 5A and 5B are cross-sectional views illustrating a method of manufacturing an array substrate of an LCD according to an another embodiment of the present invention.
Figure 5B:
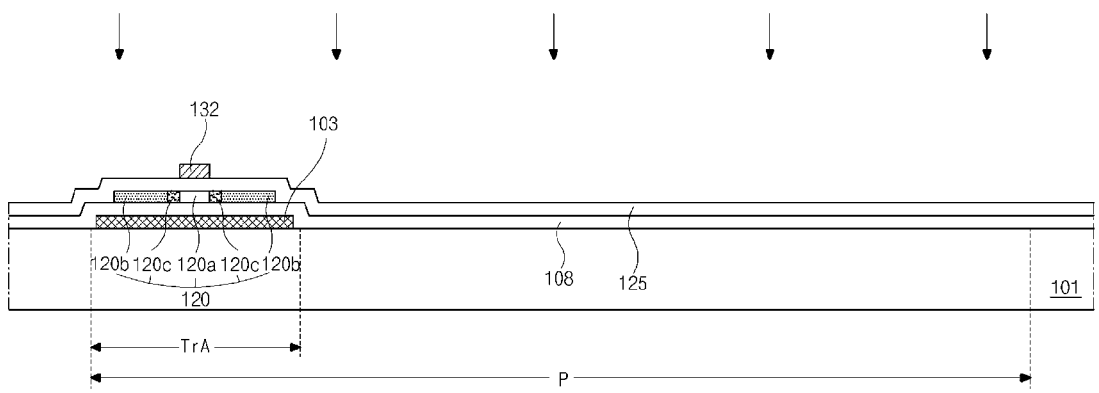

Alternatively, in an another embodiment that shown in FIGS. 5A and 5B, when a ohmic contact layer 120b is doped with n type impurities, a photoresist pattern 390 is formed on a gate electrode 132 and has a width greater than that of the gate electrode 132. A first doping with n type impurities of a first dose concentration is performed with the photoresist pattern 390 as a doping mask to form the ohmic contact layer 120b. Then, the photoresist pattern 390 is removed, and then a second doping with n type impurities of a second dose concentration less that the first dose concentration is performed to form an LDD (lightly doped drain) layer 120c between an active layer 120a and the ohmic contact layer 120b. In this case of further forming the LDD layer 120c, one mask process is added and performed.

Referring to FIG. 4F, an inorganic insulating material such as silicon nitride (SiNx) or silicon oxide (SiO$_2$), or an organic insulating material such as benzocyclobutene (BCB) or photo acrylic is deposited on the substrate 101 having the gate electrode 132 to form an inter-layered insulating film 140. The inter-layered insulating film 140 is patterned to form first and second semiconductor contact holes 143a and 143b exposing the respective ohmic contact layers 120b.

Referring to FIG. 4G, one or more of metals including aluminum (Al), aluminum alloy (e.g., AlNd), copper (Cu), copper alloy, molybdenum (Mo), and molybdenum-titanium (MoTi) is deposited on the gate insulating layer 125 to form a second metal layer having a single-layered or multi-layered structure. The second metal layer is patterned with a mask process to form source and drain electrodes 148 and 150, which contact the ohmic contact layers 120b through the first and second semiconductor contact holes 143a and 143b, respectively, and a data line 145 connected to the source electrode 148 and crossing the gate line 131 to form the pixel region P, as shown in FIG. 7.

The semiconductor layer 120, the gate insulating layer 125, the gate electrode 132, the inter-layered insulating film 140, and the source and drain electrodes 148 and 150 form the thin film transistor Tr.

Figure 8:
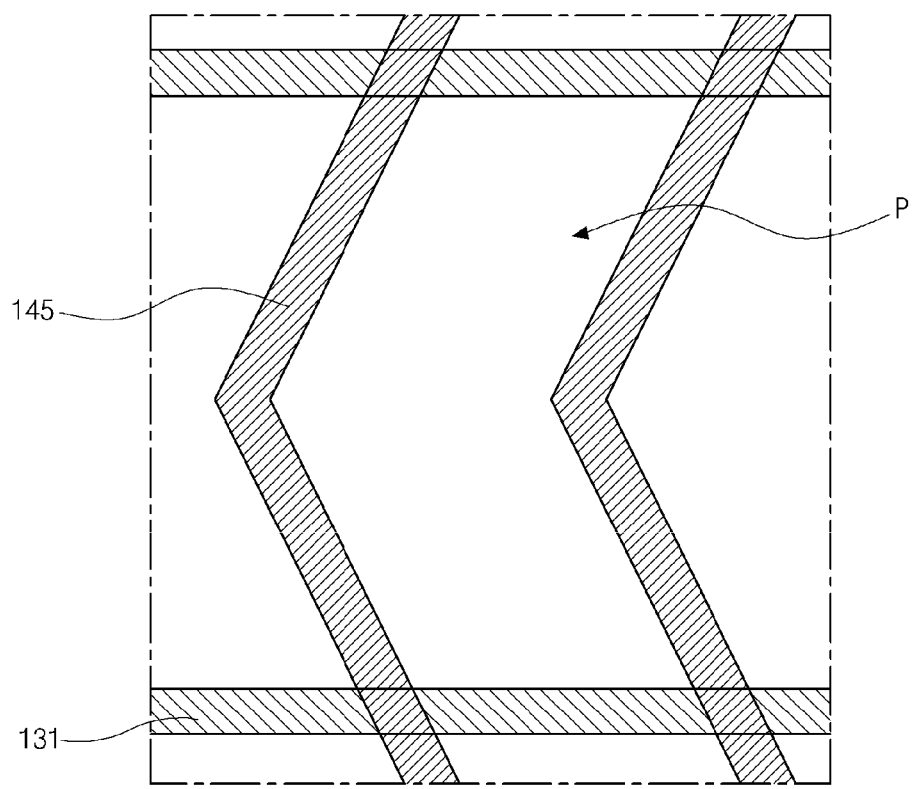
FIG. 8 is a plan view illustrating a data line having a bent portion according to the embodiment of the present invention.

The data line 145 may have a straight shape, or a zigzag shape in plane. In the case of the zigzag shape, referring to FIG. 8, the data line 145 has a bent portion corresponding to a center portion of the pixel region P to be symmetrical with respect to the bent portion, and multi domains can thus be formed in the pixel region P.

Figure 6:
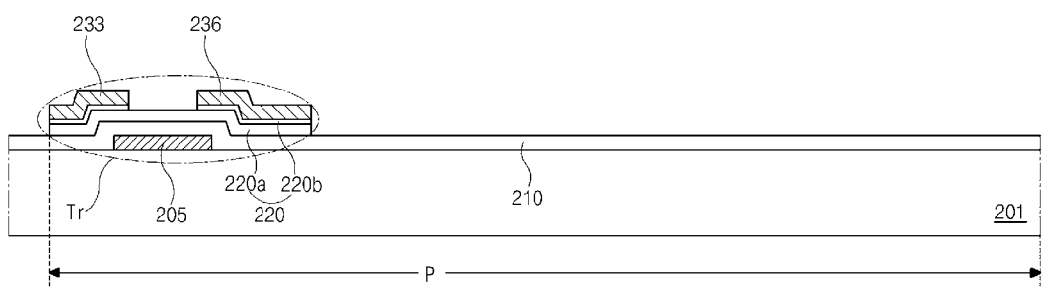
FIG. 6 is a cross-sectional view illustrating a method of manufacturing an array substrate of an LCD according to an another embodiment of the present invention.

In the embodiment, the top gate type thin film transistor 120 is shown as an example. Alternatively, in another embodiment that is shown in FIG. 6, a bottom gate type thin film transistor Tr may be used. In more detail, the bottom gate type thin film transistor Tr includes a gate electrode 205 on a substrate 201, a gate insulating layer 210, a semiconductor layer 220 including an active layer 220a of intrinsic amorphous silicon and an ohmic contact layer 220b of impurity-doped amorphous silicon, and source and drain electrodes 233 and 236. In this case, a gate line (not shown) is formed at the same process of forming the gate electrode 205, and a data line (not shown) is formed at the same process of forming the source and drain electrodes 233 and 236. This thin film transistor Tr does not need a light-blocking layer and an impurity-doping process and can be formed with 3 mask processes.

Referring to FIG. 4H, an organic insulating material such as benzocyclobutene (BCB) or photo acrylic is deposited on the substrate 101 having the source and drain electrodes 148 and 150 to form a first passivation layer 155 that has a substantially even surface.

Although not shown in the drawings, the first passivation layer 155 is patterned such that ends of the gate line and the data line 145 in a non-display region are exposed. The non-display region is located outside a display region including a plurality of pixel regions P.

Further, removing a portion of the first passivation layer 155 corresponding to a portion of the non-display region is for improving adhesion of the array substrate to a color filter substrate with a seal pattern therebetween and preventing from being torn off because the seal pattern has adhesion to an organic material better than adhesion to an inorganic material.

Referring to FIG. 4I, a transparent conductive material such as indium-tin-oxide (ITO) or indium-zinc-oxide (IZO) is formed on the first passivation layer 155 to form a first transparent conductive material layer and is patterned with a mask process to form a common electrode 160 including a first opening op1 that exposes the switching region TrA.

A portion of the common electrode 160 in the non-display region may be removed. Although not shown in the drawings, the common electrode 160 is electrically connected to a common line that is formed in the same process of forming the gate line or the data line 145.

In the embodiment, the common electrode 160 having the first opening op1 corresponding to the switching region TrA is shown as an example. Alternatively, the common electrode 160 may be formed individually in each pixel region P, and in this case, the common electrodes 160 may be electrically connected to one another through a connection pattern that is formed at a boundary portion between neighboring pixel regions P and at the same process of forming the common electrode 160.

Referring to FIG. 4J, the substrate 101 having the common electrode 160 is placed in a vacuum chamber of a chemical vapor deposition apparatus, and then the chamber 195 is under a first condition that an internal temperature is about 210 degrees Celsius to about 230 degrees Celsius, a pressure is about 1000 mT to about 1200 mT, a power is about 700 W to about 900 W, gas flow rates of ammonia ($NH_3$) and silane ($SiH_4$) flowing in the chamber 195 are about 580 sccm to about 700 sccm and about 90 sccm to about 120 sccm. Accordingly, a second passivation layer 162 made of silicon nitride is formed on the common electrode 160.

Then, referring to FIG. 4K, the above condition of the chamber 195 is changed into a second condition that an internal temperature is about 210 degrees Celsius to about 230 degrees Celsius, a pressure is about 1700 mT to about 1900 mT, a power is about 1200 W to about 1400 W, gas flow rates of ammonia ($NH_3$) and silane ($SiH_4$) flowing in the chamber 195 are about 280 sccm to about 360 sccm and about 140 sccm to about 180 sccm. Accordingly, an auxiliary insulating layer 166 of silicon nitride is formed on the second passivation layer 162.

The second passivation layer 162 and the auxiliary insulating layer 166 are formed in the same chamber 195 and of the same material (i.e., silicon nitride). However, the second passivation layer 162 and the auxiliary insulating layer 166 are formed in the different conditions. In other words, the condition to form the auxiliary insulating layer 166 has greater pressure and power, a less gas flow rate of ammonia ($NH_3$), a greater gas flow rate of silane ($SiH_4$) than that to form the second passivation layer 162. Accordingly, a difference in molecule density and the like between the two layers 162 and 166 is made. Because of this, when a dry etching process meeting a specific condition is performed, a difference in etching rate between the layers 162 and 166 is made. The specific condition is explained below.

Referring to FIG. 4L, a photoresist layer 190 is formed on the auxiliary insulating layer 166. In the embodiment, the photoresist layer 190 using a negative type photoresist is shown as an example, and the negative type has a property that a portion exposed to light remains. Alternatively, a positive type photoresist may be used.

A photo mask 199 is located over the photoresist layer 190. The photo mask 199 includes a transmissive portion TA that transmits substantially 100% of light incident thereon, a blocking portion BA that block light incident thereon, a semi-transmissive portion HTA that transmits substantially 10% to 90% of light incident thereon. A UV (ultra violet) light may be irradiated.

The blocking portion BA may correspond to the drain electrode 150. The semi-transmissive portion HTA may correspond to a region, where finger portions of a pixel electrode (170 of FIG. 4R) are formed, except for another region, where second openings (op2 of FIG. 4R) of the pixel electrode 170, among regions where the pixel electrode is formed. The transmissive region TA may correspond to other regions except for the regions corresponding to the blocking portion BA and the semi-transmissive portion HTA.

Referring to FIG. 4M, the light-exposed photoresist layer 190 is developed to form a first photoresist pattern 190a having a first thickness and a second photoresist pattern 190b having a second thickness less than the first thickness. A portion of the photoresist layer 190 corresponding to the drain electrode 150 is removed and a portion the auxiliary insulating layer 166 corresponding to the removed portion of the photoresist layer 190 is exposed.

Referring to FIG. 4N, using the first and second photoresist patterns 190a and 190b as an etching mask, the auxiliary insulating layer 166, the second passivation layer 162 and the first passivation layer 155 are sequentially etched to form a drain contact hole 163 exposing the drain electrode 150.

Referring to FIG. 4O, an ashing process is performed for the substrate 101 after forming the drain contact hole 163 to remove the second photoresist pattern 190b and expose the auxiliary insulating layer 166 below the second photoresist pattern 190b. In the ashing process, the first photoresist pattern 190a is partially removed and reduced in thickness but it remains on the substrate 101.

Referring to FIG. 4P, the substrate 101 is placed in a chamber 197 of a dry etching apparatus. The chamber 197 is under a condition that an internal pressure is about 140 mT to about 160 mT, a power is about 270 W to about 330 W, and gas flow rates of sulfur hexafluoride ($SF_6$), oxygen ($O_2$), helium (He), and chlorine ($Cl_2$) to etch the auxiliary insulating layer 166 and the second passivation layer 166 are about 100 sccm to about 150 sccm, about 30 sccm, about 30 sccm, and about 30 sccm, respectively. Under the condition, the auxiliary insulating layer is etched with the ashed first photoresist pattern 190a as an etching mask.

The etching may be an isotropic etching, and the auxiliary insulating layer 166 is thus etched faster than the second passivation layer 162. In this case, by appropriately adjusting an isotropic etching time, the auxiliary insulating layer 166 exposed between the first photoresist patterns 190a are removed and the second passivation layer 162 therebelow is exposed. Further, the auxiliary insulating layer 166 covered by the first photoresist pattern 190a and remaining on the second passivation layer 162 has a width less than a width of the first photoresist pattern 190a, which forms an undercut shape. The auxiliary insulating layer 166 of the undercut shape becomes an insulating pattern 167.

The second passivation layer 162 is partially etched due to the isotropic etching for the auxiliary insulating layer 166, and a diameter of the drain contact hole 163 thus increases.

Referring to FIG. 4Q, a transparent conductive material such as indium-tin-oxide (ITO) or indium-zinc-oxide (IZO) is deposited on the substrate 101 having the first photoresist pattern 190a to form a second transparent conductive material layer 171.

The second transparent conductive material layer 171 may have a thickness less than that of the insulating pattern 167. Because of the undercut shape, side portions of the first photoresist pattern 190a are spaced apart from the second passivation layer 162 in cross-section, and thus a portion of the second transparent conductive material layer 171 on the first photoresist pattern 190a and another portion of the second transparent conductive material layer 171 on the second passivation layer 162 are disconnected.

Accordingly, the portion of the second transparent conductive material layer 171 that is on the second passivation layer 162 and contacts the drain electrode 150 through the drain contact hole 163 forms a pixel electrode 170 in each pixel region P.

Referring to FIG. 4R, the substrate 101 having the second transparent conductive material layer 171 is exposed to a developing solution that reacts with and dissolves the first photoresist pattern 190a. Accordingly, the first photoresist pattern 190a is removed from the substrate, which is referred to as a lift-off process. In other words, when the first photoresist pattern 190a is removed, the second transparent conductive material layer 171 thereon is removed together with the first photoresist pattern 190a. Accordingly, on the second passivation layer 162, the insulating pattern 167 and the pixel electrode 170 finally remain. The lift-off process can be efficiently achieved because the developing solution easily penetrates into a lower portion of the first photoresist pattern 190a by the structure that the insulating pattern 167 and the first photoresist pattern 190a form the undercut shape and the thickness of the second transparent conductive material layer 171 has the thickness less than that of the insulating pattern 167.

The portions, where the insulating layer 167 is formed, form the second openings op2 of the pixel electrode 170. In other words, the insulating layer 167 looks as if it was formed in the second openings op2 of the pixel electrode 170.

In this case, the pixel electrodes 170 i.e., finger portions thereof, and the second openings op2 may have a straight shape or bent shape according to the straight shape or bent shape of the data line as described above.

Although not shown in the drawings, before the lift-off process, a thermal treatment may be performed for the substrate 101 having the second transparent conductive material layer 171 at a temperature is about 130 degrees Celsius t about 150 degrees Celsius for about 10 minutes to about 20 minutes. Through the thermal treatment, the first photoresist pattern is expanded in volume, and cracks thus occur in the second transparent conductive material layer 171 on the first photoresist pattern 190a. In this state, when the lift-off process is performed, the developing solution can penetrates through the cracks into the first photoresist pattern 190a and react with the first photoresist pattern 190a better. This can make the lift-off process more efficient.

Through the above-described processes, the array substrate can be manufactured. The array substrate is coupled to an opposing substrate, for example, a color filter substrate with a liquid crystal layer therebetween, and the FFS mode LCD device can thus be manufactured.

As described above, the array substrate can be manufactured with 8 mask processes when the thin film transistor is formed using the polysilicon semiconductor layer or with 6 mask processes when the thin film transistor is formed using the amorphous silicon semiconductor layer. Accordingly, production processes, cost and time can be reduced compared to the related art, and production efficiency can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for a fringe field switching mode liquid crystal display, the substrate comprising:
    a thin film transistor in a pixel region on a substrate;
    a first passivation layer on the thin film transistor;
    a common electrode on the first passivation layer;
    a second passivation layer on the common electrode;
    an insulating pattern of a bar shape on the second passivation layer and having a first thickness; and
    a pixel electrode on the second passivation layer, comprising a plurality of openings filled with the insulating pattern and defining the insulating pattern, the pixel electrode contacting a drain electrode of the thin film transistor through a drain contact hole that is formed in the first and second passivation layers,
    wherein the pixel electrode has a second thickness less than the first thickness,
    wherein a width of each portion of the insulating pattern is defined by the plurality of openings,
    wherein the openings of the pixel electrode filled with the insulating pattern form a plurality of protrusions from the pixel electrode, and
    wherein openings of the insulating pattern alternate with the openings of the pixel electrode.

2. The substrate according to claim 1, wherein the thin film transistor comprises:
    a top gate type thin film transistor comprising:
        a semiconductor layer comprising:
            an active layer comprising intrinsic polysilicon; and
            an ohmic contact layer comprising impurity-doped polysilicon at each of both sides of the active layer;
        a gate insulating layer on the semiconductor layer;
        a gate electrode on the gate insulating layer and corresponding to the active layer;
        an inter-layered insulating film on the gate electrode and exposing the ohmic contact layer; and
        a source electrode and the drain electrode on the inter-layered insulating film and each contacting the ohmic contact layer; or
    a bottom gate type thin film transistor comprising:
        a gate electrode;
        a gate insulating layer on the gate electrode;
        a semiconductor layer on the gate insulating layer and comprising:
            an active layer comprising intrinsic amorphous silicon; and
            an ohmic contact layer comprising impurity-doped amorphous silicon on the active layer; and
        source and drain electrodes on the semiconductor layer.

3. The substrate according to claim 2, further comprising;
    a gate line connected to and at the same layer as the gate electrode; and
    a data line connected to the source electrode and at the same layer as the source and drain electrodes.

4. The substrate according to claim 2, further comprising;
    a light-blocking layer corresponding to the thin film transistor; and
    a buffer layer on the light-blocking layer,
    wherein the light-blocking layer and the buffer layer are below the semiconductor layer of polysilicon.

5. The substrate according to claim 1, wherein the pixel electrode, the insulating pattern, and the data line are bent and symmetrical with respect to a center portion of each pixel region.

6. The substrate according to claim 1, wherein:
   the first passivation layer comprises an organic insulating material and has an even surface; and
   the second passivation layer and the insulating pattern comprise a same inorganic insulating material and differ in molecule density.

* * * * *